(12) United States Patent
Normoyle et al.

(10) Patent No.: US 7,332,929 B1
(45) Date of Patent: Feb. 19, 2008

(54) WIDE-SCAN ON-CHIP LOGIC ANALYZER WITH GLOBAL TRIGGER AND INTERLEAVED SRAM CAPTURE BUFFERS

(75) Inventors: Kevin B. Normoyle, Santa Clara, CA (US); Sreenivas Reddy, Castro Valley, CA (US); John Phillips, Santa Clara, CA (US)

(73) Assignee: Azul Systems, Inc., Mountain View, CA (US)

( * ) Notice: Subject to any disclaimer, the term of this patent is extended or adjusted under 35 U.S.C. 154(b) by 207 days.

(21) Appl. No.: 11/308,048

(22) Filed: Mar. 3, 2006

(51) Int. Cl.
*G06F 11/00* (2006.01)
*G01R 31/28* (2006.01)

(52) U.S. Cl. .......................... 326/16; 714/30; 714/39; 714/724; 714/726; 714/723

(58) Field of Classification Search .................. 326/16, 326/37–41, 47, 101; 714/30, 39, 724, 726, 714/733
See application file for complete search history.

(56) References Cited

U.S. PATENT DOCUMENTS

| | | | |
|---|---|---|---|
| 4,979,177 A | 12/1990 | Jackson | 377/20 |
| 6,107,821 A * | 8/2000 | Kelem et al. | 326/38 |
| 6,564,347 B1 | 5/2003 | Mates | 714/727 |
| 6,633,838 B1 * | 10/2003 | Arimilli et al. | 703/16 |
| 6,681,353 B1 | 1/2004 | Barrow | 714/724 |
| 6,687,865 B1 | 2/2004 | Dervisoglu et al. | 714/726 |
| 6,704,889 B2 | 3/2004 | Veenstra et al. | 714/39 |
| 6,760,898 B1 | 7/2004 | Sanchez et al. | 716/16 |
| 6,822,474 B2 | 11/2004 | Chaudhari | 326/16 |
| 6,826,717 B1 | 11/2004 | Draper et al. | 714/39 |
| 6,834,360 B2 | 12/2004 | Corti et al. | 714/37 |
| 6,868,376 B2 | 3/2005 | Swoboda | 703/25 |
| 6,877,114 B2 | 4/2005 | Allen et al. | 714/45 |
| 7,228,472 B2 * | 6/2007 | Johnson et al. | 714/724 |
| 2003/0126502 A1 * | 7/2003 | Litt | 714/30 |
| 2003/0126508 A1 * | 7/2003 | Litt | 714/39 |
| 2005/0010880 A1 | 1/2005 | Schubert et al. | 716/4 |
| 2005/0080581 A1 | 4/2005 | Zimmerman et al. | 702/117 |
| 2005/0166098 A1 | 7/2005 | Davis | 714/45 |
| 2005/0183069 A1 | 8/2005 | Cepulis | 717/128 |
| 2006/0036919 A1 * | 2/2006 | Creigh | 714/724 |

* cited by examiner

*Primary Examiner*—Rexford Barnie
*Assistant Examiner*—Thienvu V Tran
(74) *Attorney, Agent, or Firm*—Stuart T. Auvinen; g Patent LLC

(57) ABSTRACT

A system chip has many local blocks including processor cores, caches, and memory controllers. Each local block has a local sample-select mux that is controlled by a local selection control register. The mux selects from among hundreds of internal sample nodes in the local block, and can also pass through samples output by an upstream local block. The selected samples from local blocks are sent to a central on-chip logic analyzer that compares the samples to a maskable trigger value. When the trigger value is matched, a trigger state machine advances, and samples are stored into a central capture buffer. A user debugging the chip can later read out the central capture buffer at a slower speed. Thousands of internal nodes from local blocks can be selected for sampling, triggering, and debugging. Local blocks include valid bits in 64-bit-wide samples. Only valid samples are written to the capture buffer.

20 Claims, 8 Drawing Sheets

AT EACH LEVEL:

WIDE-SCAN ON-CHIP LOGIC ANALYZER WITH GLOBAL TRIGGER AND INTERLEAVED SRAM CAPTURE BUFFERS

FIELD OF THE INVENTION

This invention relates to integrated circuits, and more particularly to diagnostic circuits for an on-chip logic analyzer.

BACKGROUND OF THE INVENTION

Improvements in semiconductor process technology has enabled larger, more complex systems to be integrated onto a single integrated circuit chip. However, the number of physical wire interfaces to the chip are often limited, allowing only a fraction of internal signals to be visible from the chip's I/O. For example, when a large memory and a processor are integrated together as a system-on-a-chip (SOC), the address and data between the processor and the memory may not be visible on the chip's I/O. This makes debug and testing of the chip significantly more difficult, since an external logic analyzer can only observe the chip's I/O.

Internal nodes may be routed to a central block that copies data on the internal nodes to external I/O, such as through using scan chains or JTAG. However, the number of internal nodes that can be sampled is often small. Sampling may not be possible at full system speeds and may be quite awkward, necessitating time-consuming scan-out of data from serial chains.

It is usually not known in advance exactly which nodes need to be observed during debug. A designer cannot know for certain which parts of the chip will have design flaws and will be the subject of an intense debug effort. Chip designers would prefer to have as many internal nodes as possible available for sampling during debug testing. However, the additional logic and wiring needed to allow sampling of many internal nodes can be expensive.

Local history buffers may be added to key internal buses inside the chip. These buffers allow for traces of bus cycles to be captured and later read out of the chip during debug testing. However, these buffers can be expensive when many buffers or deep buffers are used. Control of these buffers can be difficult as there may be no internal triggering mechanism.

FIG. 1 shows a multi-processor system chip. Processor cores 10, 110', 10" are integrated together onto IC chip 20. Each processor core may execute a separate stream of instructions and each accesses its own local cache memory, caches 12, 12', 12". When data is not found in the local cache memory (a cache miss), memory controllers 14, 14', 14" fetch the desired data from an external memory, such as using an external bus to a large external main memory.

Snoop tags 16 contain directory information about the entries currently being stored in caches 12, 12', 12". Cache coherency is achieved through the use of snoop tags 16, perhaps in conjunction with external directories and other controllers.

Self-test logic and test controllers may also be integrated onto a very-large-scale-integration (VLSI) chip. Test controller 18 may be included on IC chip 20. Test controller 18 may be activated by a combination or sequence of signals on external pins that activates a test mode.

FIG. 2 shows prior-art test scan chains in a large chip. Test scan chains are often inserted into chips to aid automated testing. Special chip-design software can replace ordinary D-type flip-flops with testable or scan flip-flops 30 that have two D inputs and 2 clocks. The extra clock inputs to scan flip-flops 30 are driven by test clock TCK, which can be applied to an external pin of the chip and may be buffered or gated (not shown). The normal clocks are stopped during test mode and TCK is pulsed to scan in and out data along the scan chains. The extra D inputs to scan flip-flops 30 are connected to Q outputs of other scan flip-flops 30 to form a scan chain along scan flip-flops 30.

The first scan flip-flops 30 in the scan chain has a second D input that receives a test-input TI from an external pin, while the last Q output from the last scan flip-flop of the chain of scan flip-flops 30 drives a test output TO that can be read by an external tester and compared to expected data by the external tester.

When a large chip has multiple CPU blocks 22, 22', 22", the Q output of the last scan flip-flop 30 in one CPU block 22 can drive the D test input of the first scan flip-flop 30 in second CPU block 22'. Likewise, the Q output of the last scan flip-flop 30 in second CPU block 22' can drive the D test input of the first scan flip-flop 30 in third CPU block 22". Thus test scan chains of scan flip-flops 30 in CPU blocks 22, 22', 22" may be chained together into one long scan chain.

While useful, the length of the long scan chain of scan flip-flops 30 through many CPU blocks 22, 22', 22" can be excessively long, requiring many pulses of test clock TCK to scan data in and out. Testing may be inefficient, increasing test times and test costs. Isolating test failures to particular CPU blocks may be quite difficult since the scan chains from different blocks are strung together into one long scan chain. The tester log file may have to be examined to determine which of CPU blocks 22, 22', 22" caused the test failure.

Scan chains do allow for some internal node to be observed. However, a lengthy scan-out sequence is needed to scan a sampled node out through the many flip-flops 30 in a scan chain. Determining the exact time of sampling may be difficult. Also, there is no provision for triggering or initiating sampling on an event such as a certain value of internal nodes. Instead, internal nodes have to be scanned out and then compared to the trigger value. The scan-out process itself can over-write internal nodes, causing internal nodes to change values. Thus capturing a sequence of internal states instead of just a one-time sample is difficult or impossible using scan chains.

FIG. 3 show a multi-processor chip with local history buffers. Debug buffer 24 can capture signals such as address and data on a bus between processor core 10 and cache 12. Debug buffer 26 can capture signals such as address and data on another bus between cache 12 and memory controller 14. Debug buffer 28 can capture address, data, or other information on a snoop bus that connects memory controllers 14, 14' and snoop tags 16.

Likewise, debug buffers 24', 26' capture internal bus signals between processor core 10', cache 12', and memory controller 14'. These internal buses may observed by triggering debug buffers 24, 24', 26, 26', 28 to begin to write data from their bus, and then halting the processor clock or otherwise ending writing of data into the debug buffers. The debug buffers are then read by some mechanism.

While useful, the size of debug buffers 24, 24', 26, 26', 28 may be limited, allowing only a few samples to be captured. When debug buffers 24, 24', 26, 26', 28 are made larger, the overall size and cost of these buffers can increase significantly, especially when many processors and caches are integrated onto the same chip. The use of debug buffer memory is inefficient, since only one bus may need to be watched, yet many debug buffers are provided since it is not known in advance which bus will need to be watched. Also, there may be no provision for triggering on an internal event or bus value.

What is desired is an on-chip logic analyzer for debug testing of a large chip. An on-chip logic analyzer that can observe many internal nodes from many different blocks is desired. An on-chip logic analyzer that can trigger sampling and storage of these nodes using internal bus states is desirable. An on-chip logic analyzer that does not significantly degrade performance of the chip, yet is able to sample signals at a high rate is further desired.

DETAILED DESCRIPTION

The present invention relates to an improvement in on-chip logic analyzers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that sampling of internal signal nodes on a large chip is inherently distributed across the chip, since the internal nodes are located at different physical locations on the chip. However, storage of the sampled signals can still be centralized, allowing a single debug buffer to store samples signals at a central location for all internal nodes that are sampled. Since only a small subset of the many available internal nodes is likely to be looked at when a feature is debugged, only a subset of the available internal signal nodes needs to be stored in the central debug buffer at any particular time. Thus a single debug buffer can be used for storing samples from internal signal nodes. Having a single debug buffer is much more efficient than having many local history buffers, since the single debug buffer is shared among many internal signal nodes.

Furthermore, fairly complex trigger logic may be used with the single debug buffer, since the trigger logic does not need to be replicated many time. Instead, centralized trigger logic can compare sampled signals to a trigger value and store the sampled signals into the central debug buffer on a match. Counters may also be used with the trigger logic to store a predetermined number of samples before or after the trigger value is matched. Counters could also be used to count occurrences of a trigger, which is useful for performance and statistical analysis.

Parallel paths from internal signal nodes to the central trigger logic and debug buffer can allow for doubling of the effective sampling frequency. Long signal lines from the internal signal nodes, which are distributed around the chip, to the central trigger logic and debug buffer, are operated at half the normal clock frequency. Samples may be stored from the parallel paths in an interleaved fashion using the full speed clock, or from just one path at the half-speed frequency. The central debug buffer may be divided into several partitions to allow for interleaving of samples.

Figure 4:
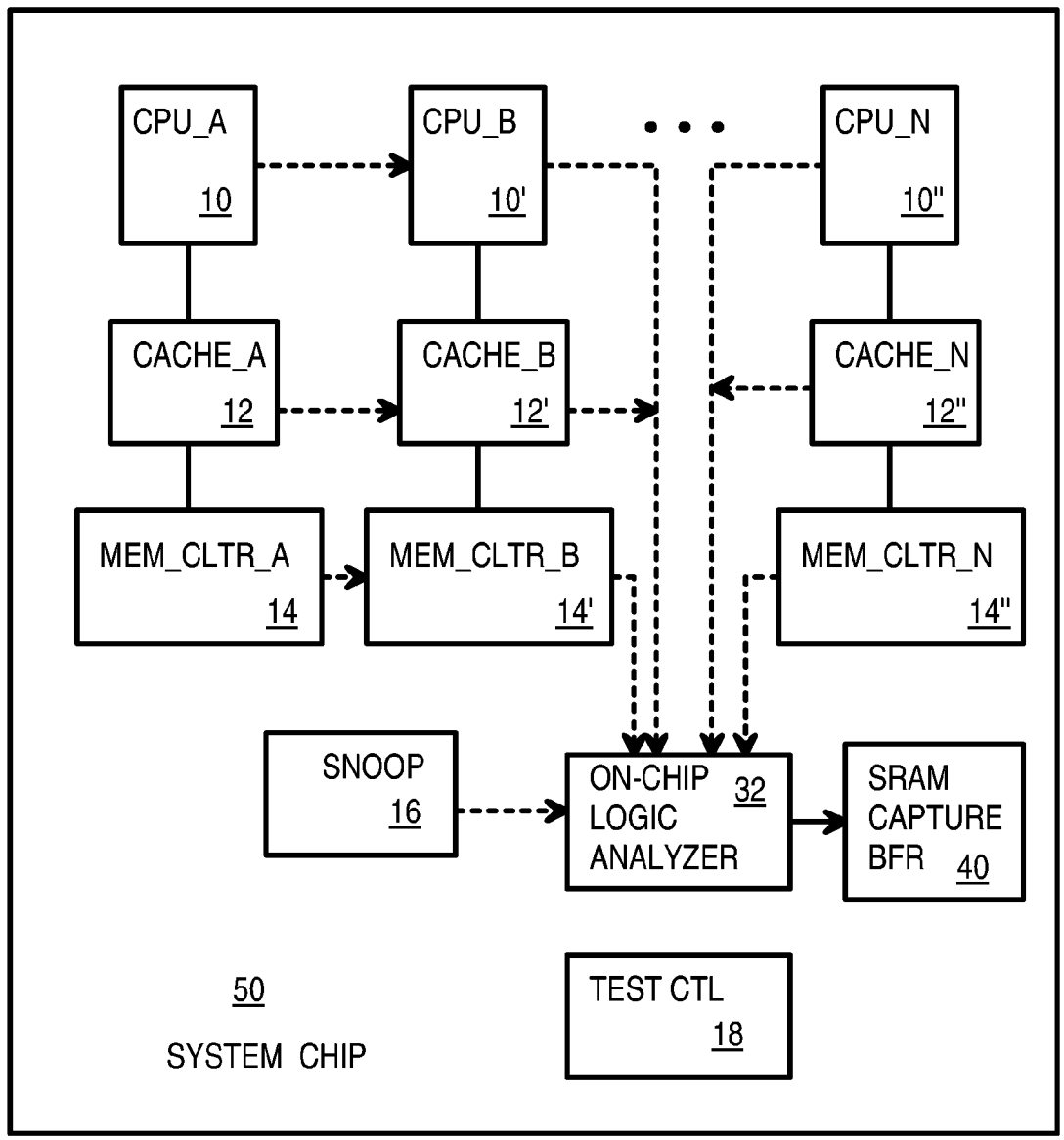
FIG. 4 shows a multi-processor chip with internal signals nodes distributed around the chip that are sampled and stored in a central debug buffer using centralized trigger logic.

FIG. 4 shows a multi-processor chip with internal signals nodes distributed around the chip that are sampled and stored in a central debug buffer using centralized trigger logic. On-chip logic analyzer 32 receives signals carried over long lines from blocks distributed around system chip 50. Blocks include processor cores 10, 10', 10", caches 12, 12', 12", memory controllers 14, 14', 14", and snoop tags 16, and could include other blocks. For example, a chip with 16 processor cores could have 16 processor blocks, 8 cache blocks, and 4 memory controller blocks, and perhaps some I/O blocks.

Each block has many internal signal nodes that may be sampled, and each block contains select logic to select a subset of the internal signals nodes in that block to send to on-chip logic analyzer 32. For example, processor core 10 may select signals within its program counter to send to on-chip logic analyzer 32, while cache 12' may send address signals to on-chip logic analyzer 32. Another processor core 10" may select an operand bus to send to on-chip logic analyzer 32, while memory controller 14' may select read/write control signals to send to on-chip logic analyzer 32. Snoop tags 16 could send snoop addresses to on-chip logic analyzer 32.

Selection of signals within a block may be determined by programmable registers within that block, or by some other method. Multiplexers, buses with multiple drivers than can be enabled and disabled, or even a switch fabric could be used to select from among hundreds of internal signal nodes within a block.

Blocks may also be chained together, such as in a daisy chain, and pass on signals sampled from another blocks rather than signals sampled from that block. For example, data signals from cache 12 may be sampled and sent to cache 12', which passes the data signals through to on-chip logic analyzer 32.

On-chip logic analyzer 32 may also contain select logic to select from among several groups of sampled signals from different blocks. For example, on-chip logic analyzer 32 could select signals from processor core 10' and ignore signals from caches 12, 12', 12".

Compare logic within on-chip logic analyzer 32 compares the sampled signals that are selected to one or more trigger values that may be programmed into a programmable register for on-chip logic analyzer 32. When selected sampled signals match a trigger value, on-chip logic analyzer 32 can store the sampled signals that are selected into a central debug buffer, capture buffer 40. A counter may be activated or stopped by the trigger-value match, causing a predetermined number of samples after or before the trigger value to be stored into capture buffer 40.

Figure 1:
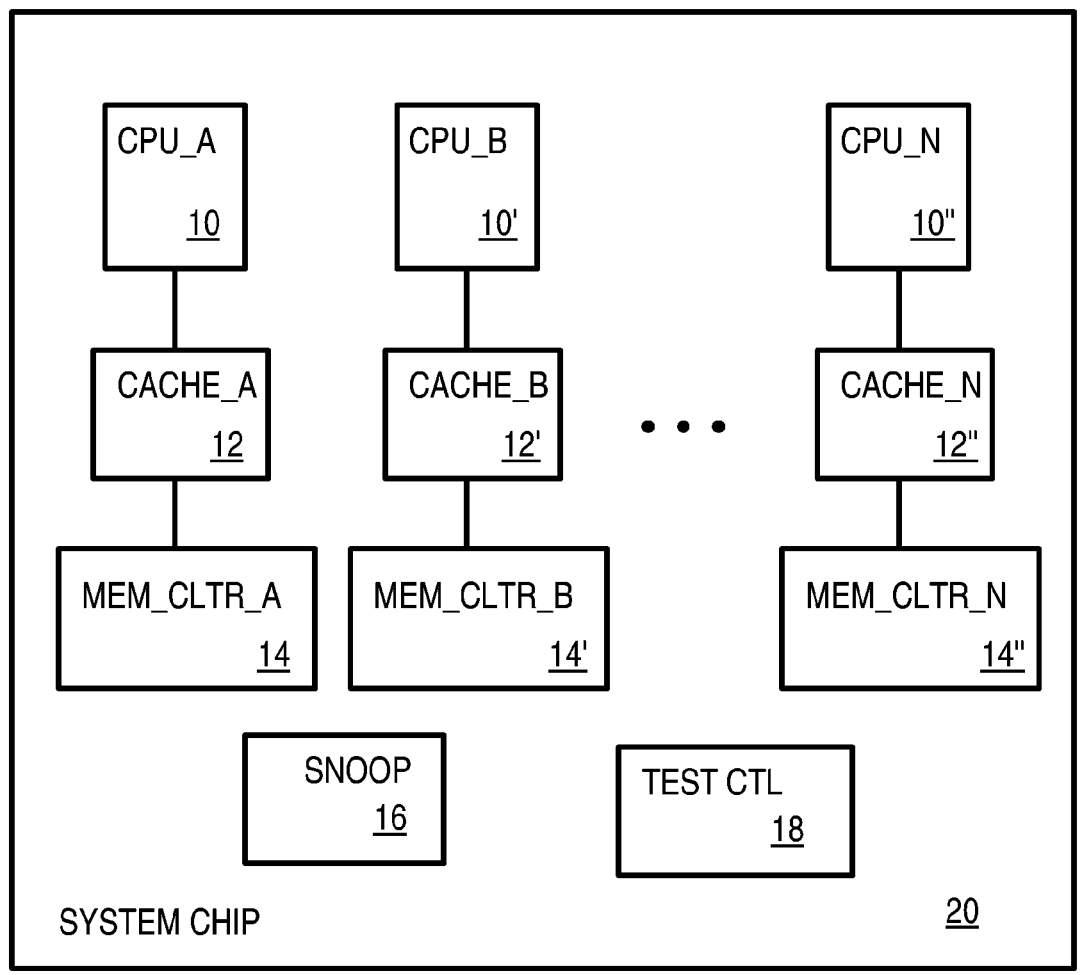
FIG. 1 shows a multi-processor system chip.
Figure 2:
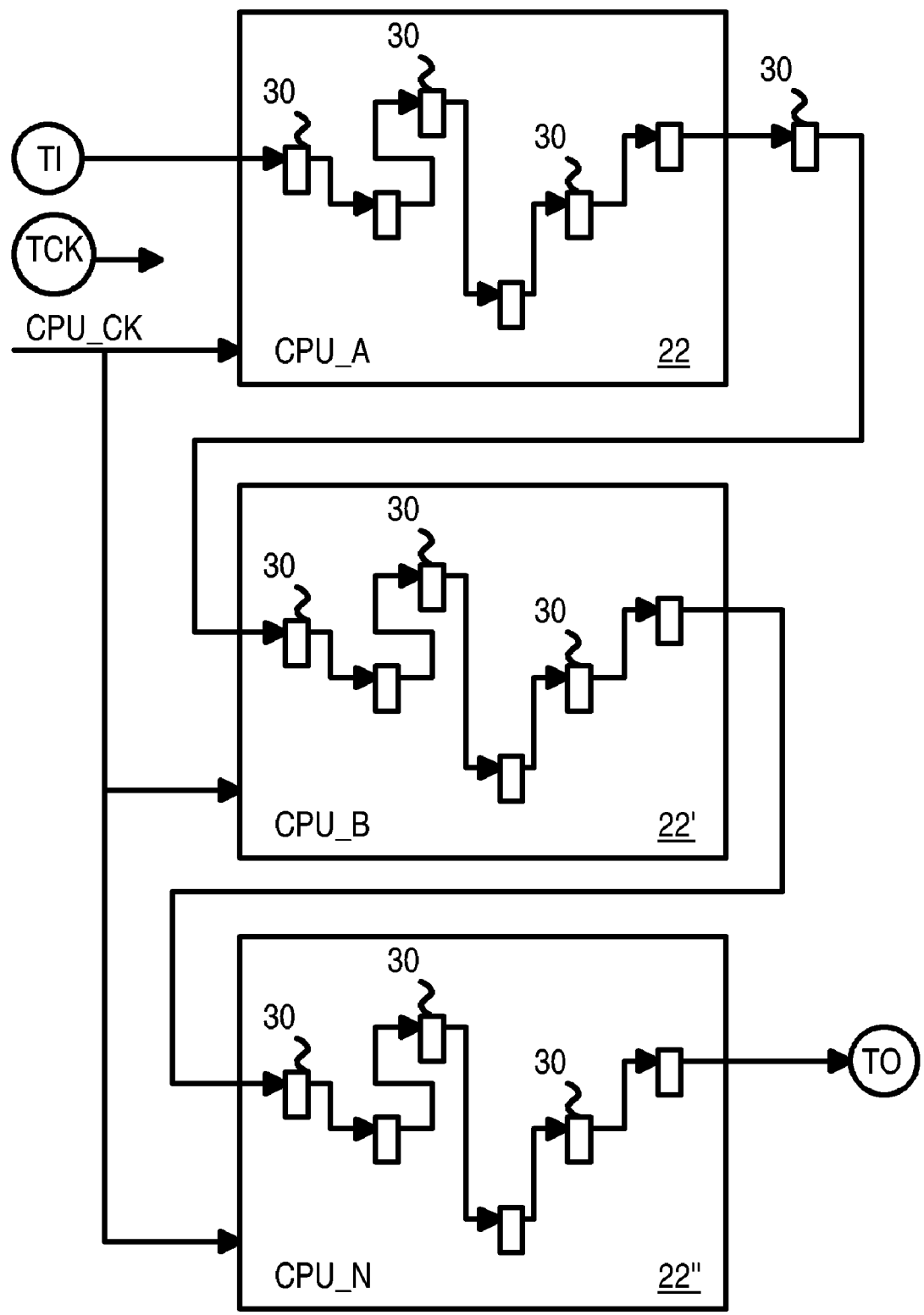
FIG. 2 shows prior-art test scan chains in a large chip.
Figure 3:
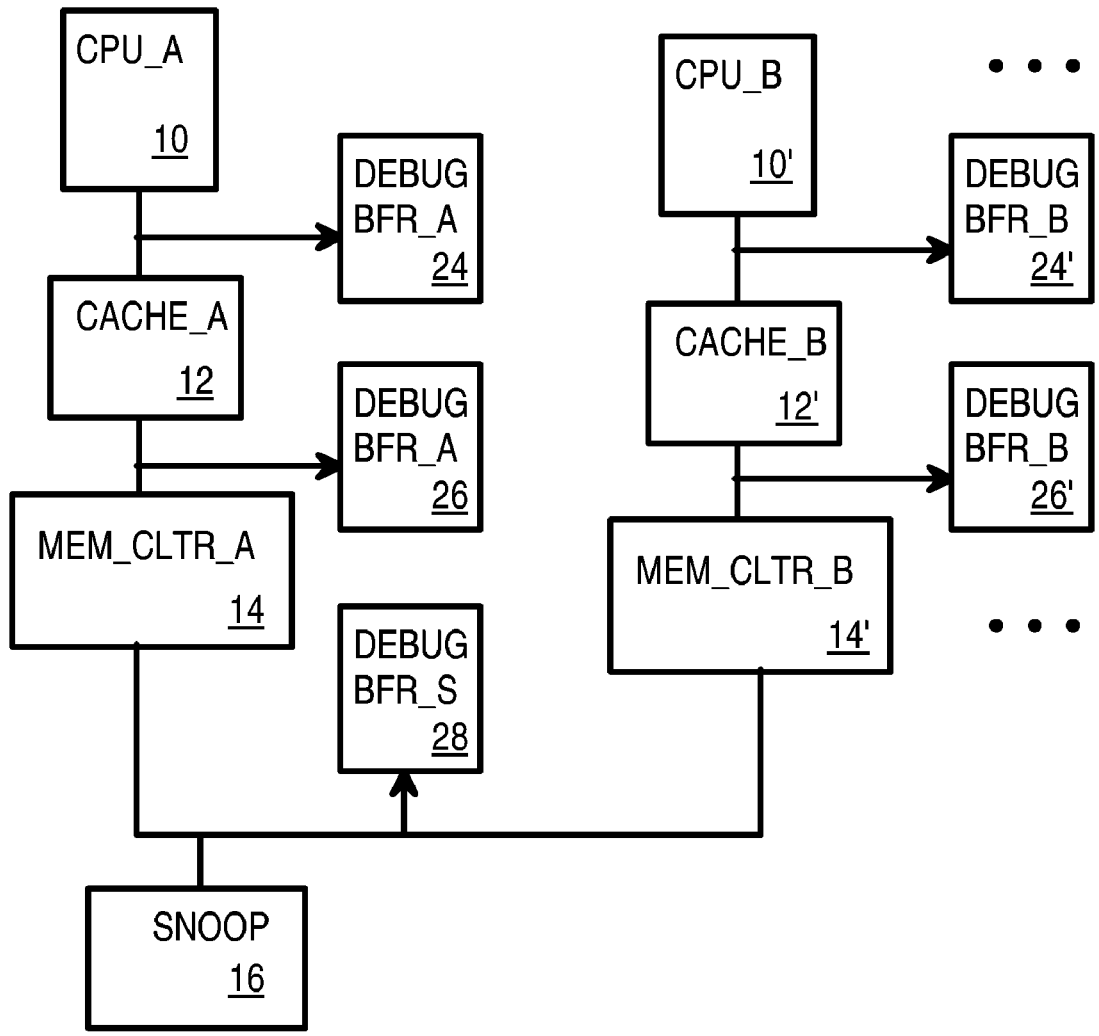
FIG. 3 show a multi-processor chip with local history buffers.

Although hundreds or even thousands of internal signal nodes may be sampled from among many blocks distributed around system chip 50, only a single buffer (capture buffer 40) is needed, since on-chip logic analyzer 32 selects from among the many inputs, and each block performs local selection of signals within the block to forward to on-chip logic analyzer 32. The size of capture buffer 40 can be larger than the size of each of the many debug buffers 24, 24', 26, 26', 28 of FIG. 3, since there is only one of capture buffer 40 on system chip 50. Likewise, more complex trigger, mask and match logic may be used in on-chip logic analyzer 32 since this centralized trigger logic is shared among many hundreds or thousands of internal signal nodes that can be sampled.

Each of the long lines from blocks to on-chip logic analyzer 32 are parallel buses that may each carry many sampled signals in parallel. For example, 64 lines from processor core 10" to on-chip logic analyzer 32 can carry 64 sampled signals at a time. Since these lines are longer than lines within a block, these long lines may operate at half the normal clock frequency of blocks such as processor core 10". The 64 long lines may be grouped into two 32-bit sets, allowing 32 signals to be stored per processor clock period when the two 32-bit sets are interleaved.

Figure 5:
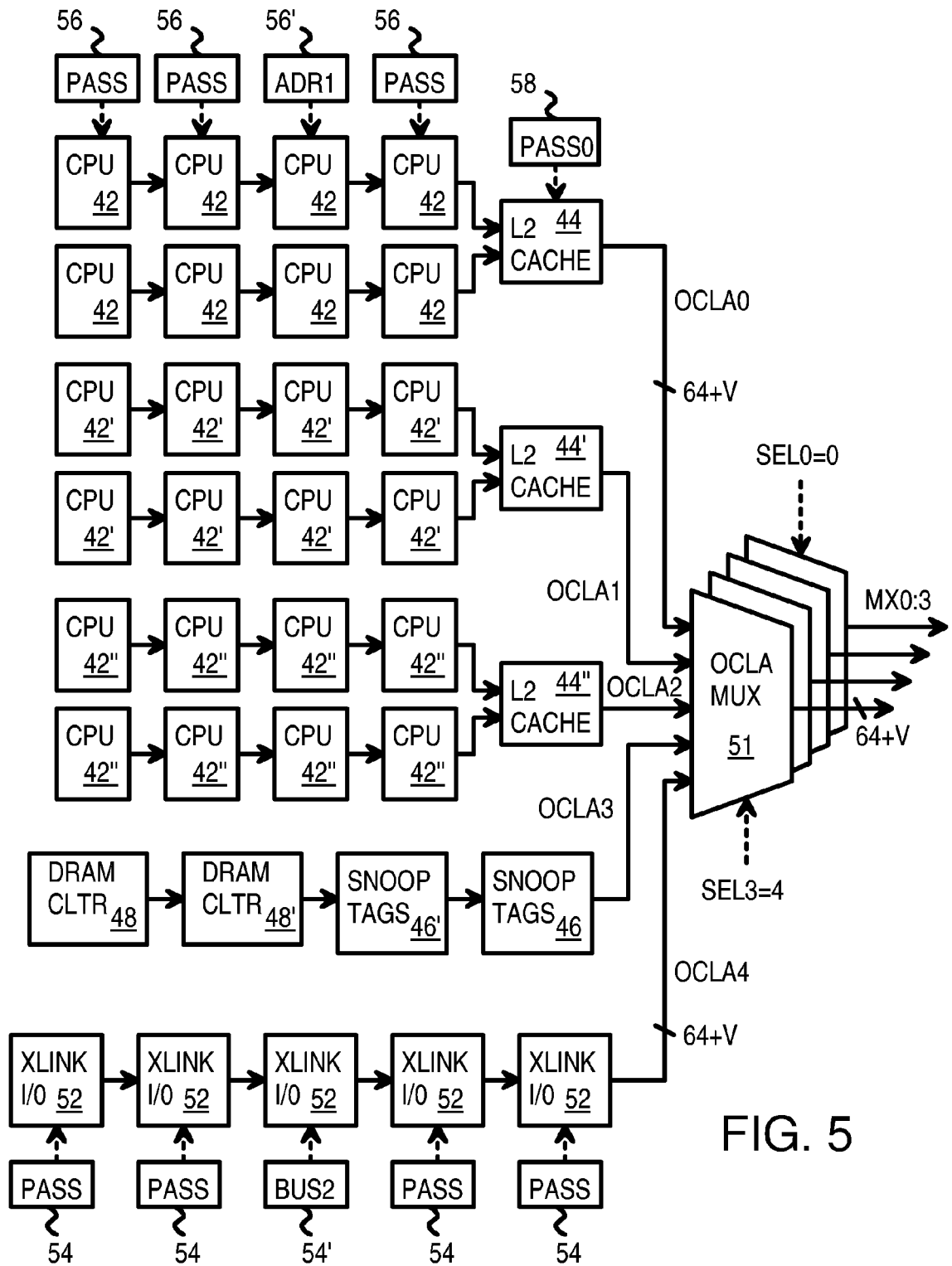
FIG. 5 is a diagram of selection of internal signals for sampling by both distributed and centralized selection logic.

FIG. 5 is a diagram of selection of internal signals for sampling by both distributed and centralized selection logic. Blocks on a system chip may be chained together rather than each block directly sending its sampled signals to the central on-chip logic analyzer (OCLA). Four central processing units CPU's 42 are connected in a chain and then send sampled signals to cache 44. Another four CPU's 42 are also chained together and the last CPU 42 in the chain of four sends its sampled signals to cache 44.

Each CPU 42 contains hundreds of internal signal nodes that may be sampled. The internal signal nodes selected to be passed on to the next CPU 42 in a chain are determined by selection control register 56. Each CPU 42 is controlled by a selection control register 56. For example, the first CPU 42 in the upper left of FIG. 5 is controlled by a first selection control register 56 that does not select any internal signal. The second CPU 42 in the top chain is controlled by a second selection control register 56 that is programmed to "PASS" or pass through signals from the prior CPU in the chain and does not select any internal signal. An internal address bus is selected from the third CPU 42 in the top chain by selection control register 56' which is programmed to select "ADR1" for output. The fourth CPU 42 in the top row is programmed to pass on the samples from the third CPU since its selection control register 56 is also programmed to PASS, or pass-through mode.

Cache 44 selects its top input from the fourth CPU 42 of the top row, since selection control register 58 that controls cache 44 is programmed to PASS0, or pass the upper input. Thus address bus ADR1 in the third CPU 42 of the top row is selected and passed through cache 44 by the programming shown in selection control registers 56, 58. The sampled ADR1 bus is copied to long lines OCLA0 and sent to the central on-chip logic analyzer.

Other CPU's 42' also have selection control registers that are not shown, and output to long lines OCLA1 through cache 44'. Another group of 8 CPU's 42" output sampled signals to a third set of long lines OCLA2 through cache 44". Each CPU 42', 42" may have its own selection control register 56 (not shown), and each and cache 44', 44' may have its own selection control register 58 (not shown), but selection control registers 56, 58 are only shown for the top row of CPU's 42 and cache 44 in FIG. 5.

Specialized input-out (I/O) blocks may also sample signals. Cross-link blocks 52 are specialized I/O blocks that transmit and receive packets among different system chips. Other kinds of I/O blocks could be substituted. Selection control register 54, 54' determine which internal signal nodes in cross-link blocks 52 are selected to be passed on in the chain. When selection control registers 54 are programmed to PASS, then a prior block's sampled signals are passed through and no internal signals from that block are selected.

For example, a second bus BUS2 from the middle cross-link block 52 is selected by selection control register 54' and passed through the remaining two cross-link blocks 52 since selection control register 54 for the other cross-link blocks 52 are programmed to PASS. Thus BUS2 from the middle cross-link block 52 is driven onto long lines OCLA4 for capture by the on-chip logic analyzer.

Other kinds of blocks on the system chip may likewise be chained together and pass on sampled signals. Memory controllers 48, 48' and snoop tags 46', 46 are chained together and drive long lines OCLA3 to the on-chip logic analyzer. Additional selection control registers (not shown) may control which internal signal nodes in each block are selected to be passed on to the next block in the chain, and when to pass through a prior block's sampled signals. The final block in the chain, snoop tags 46, drives long lines OCLA2, and may have additional higher-power line drivers.

Each of the five OCLA buses has 64 sampled signals that may include one valid bit V that is generated by the block sampling the data to indicate that the sampled data is valid. For example, first and second CPU's 42 in the top row can generate V=0, while third CPU 42 generates V=1 and passes the 64 sampled signals through including this valid bit. The valid bit can be checked by the on-chip logic analyzer so that only samples with the valid bit set are be stored.

Rather than have a single debug buffer than can store sampled signals from just a single event, several debug buffers may be provided to allow for parallel debug of two or more features. OCLA muxes 51 are four muxes that each receive all five long-line 65-bit buses OCLA0:5. Each OCLA mux 51 drives a different mux bus MX0:3 to the on-chip logic analyzer. OCLA muxes 51 can be located centrally at the input to the on-chip logic analyzer, or may be part of the on-chip logic analyzer, or could be located elsewhere on the chip.

A first OCLA mux 51 could have a select input that selects OCLA0, allowing sampled signals from ADR1 of third CPU 42 in the top row to be passed on to the on-chip logic analyzer for storage. A fourth OCLA mux 51 could have a select input that selects OCLA4, allowing sampled signals from BUS2 of third cross-link block 52 to be passed on to the on-chip logic analyzer for storage. Both ADR1 and BUS2 can be sampled during the same debug setup, and even at the same time, through the parallel OCLA muxes 51.

Valid checker 68 allows only valid samples to be written into capture buffer 40. This can minimize wasted space in capture buffer 40. The blocks being sampled can generate the valid bits only for certain kinds of cycles or bus transactions, such as for bus reads. The block might use the bus read control signal as the valid bit, in that example. While an explicit valid bit could be generated and attached to the 64 data bits, valid or invalid may be inferred by the context lent by the sample source. For example, an instruction retirement address from the CPU could already include a valid/invalid bit in the 64 bit datum. The generation of the valid bit by the sampled block might be programmable.

Figure 6:
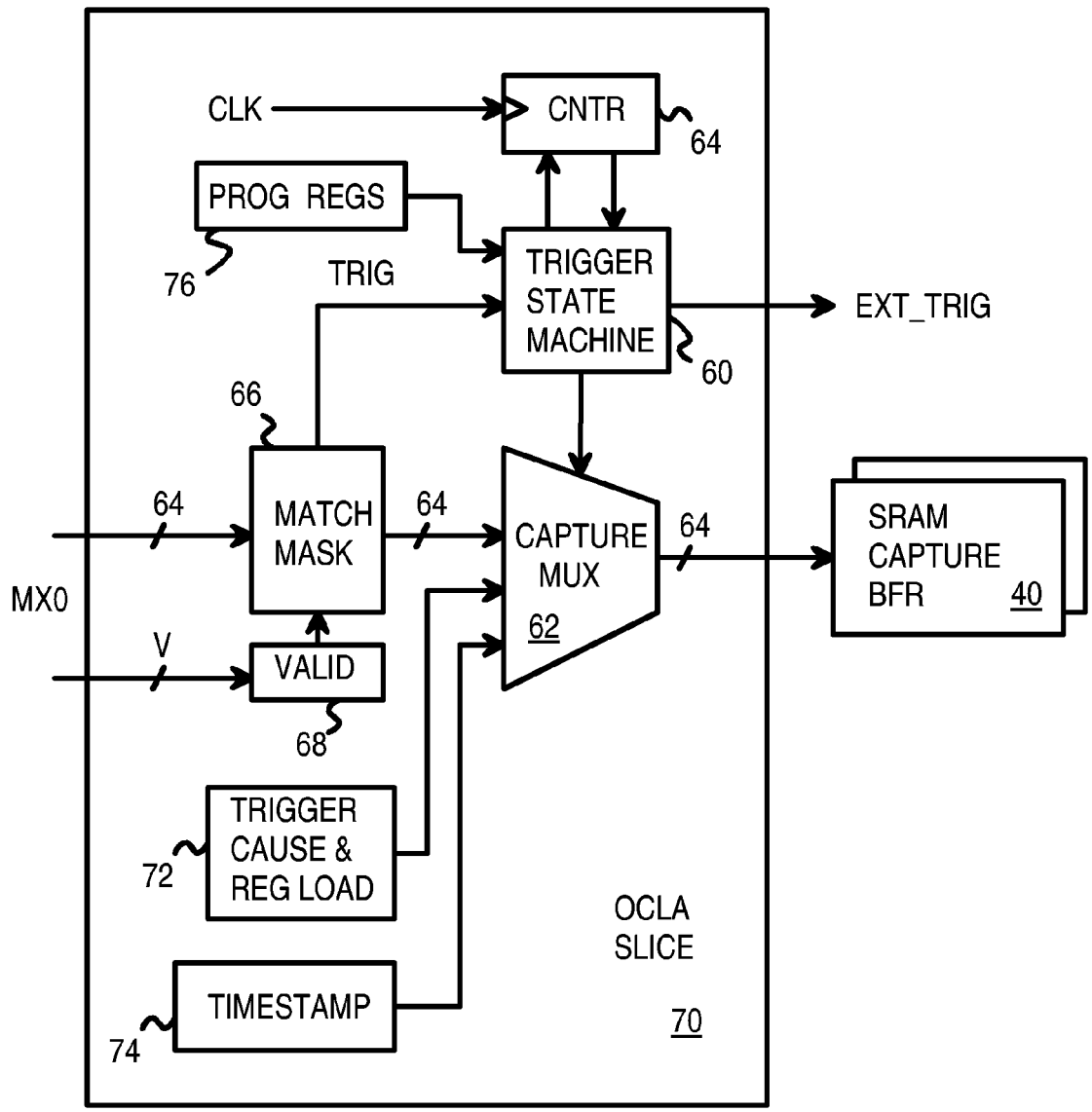
FIG. 6 shows a slice in the central on-chip logic analyzer.

FIG. 6 shows a slice in the central on-chip logic analyzer. Each OCLA slice 70 receives a different one of the four outputs of OCLA muxes 51 (FIG. 5). The 64 bits from the OCLA mux output are compared to a programmable trigger value by masking comparator 66. Some of the 64 bits may be masked so that they are ignored for comparison to the trigger value. The valid bit that was generated by the sampled block is checked by valid checker 68. When the valid bit is false, any match is invalidated and ignored.

When the valid bit is true and masking comparator 66 detects a match, then trigger state machine 60 is advanced to the next state. The next state of trigger state machine 60 could be a triggered state that causes subsequent samples that are validated by masking comparator 66 to pass from valid checker 68 through capture mux 62 for storage in capture buffer 40. Samples are then stored on subsequent clock cycles until counter 64 reaches a terminal count or expires, and trigger state machine 60 is reset by counter 64. This is a store-after-trigger mode.

Alternately, for a store-before-trigger mode, all valid samples pass through valid checker 68 and capture mux 62 and are stored in capture buffer 40, which acts as a FIFO or circular buffer, with newer samples overwriting the oldest samples stored in capture buffer 40. When masking comparator 66 detects a sample with a valid match of the trigger value, trigger state machine 60 halts writing to capture buffer 40. The samples immediately before the trigger are thus saved. A user may later read the samples stored in capture buffer 40, such as by performing reads of capture buffer 40 in a test or diagnostic mode.

Operation modes of trigger state machine 60, and the trigger value and mask values, may be stored in programmable registers 76 during setup before debugging mode begins. An external trigger signal may be activated by trigger state machine 60 when masking comparator 66 detects a valid match. This trigger signal may be routed to an external pin of the chip so that a user may monitor the chip and stop the clock once a trigger is signaled. The external trigger could also signal an internal interrupt to a processor core.

Additional diagnostic information may be written into capture buffer 40 to aid the user. For example, when a trigger occurs, the cause of the trigger may be written to capture buffer 40 from trigger loader 72. The states of various registers such as programmable register 76 may also be written into capture buffer 40 by trigger loader 72. A timestamp generated by timestamp generator 74 also may be written to capture buffer 40 through capture mux 62. These diagnostic entries could be written into capture buffer 40 before or after samples are captured in capture buffer 40, and could have a unique format so as to be easily identified by a user reading capture buffer 40. The timestamp could be added after each sample, or before just the first sample in a sequence.

Figure 7A:
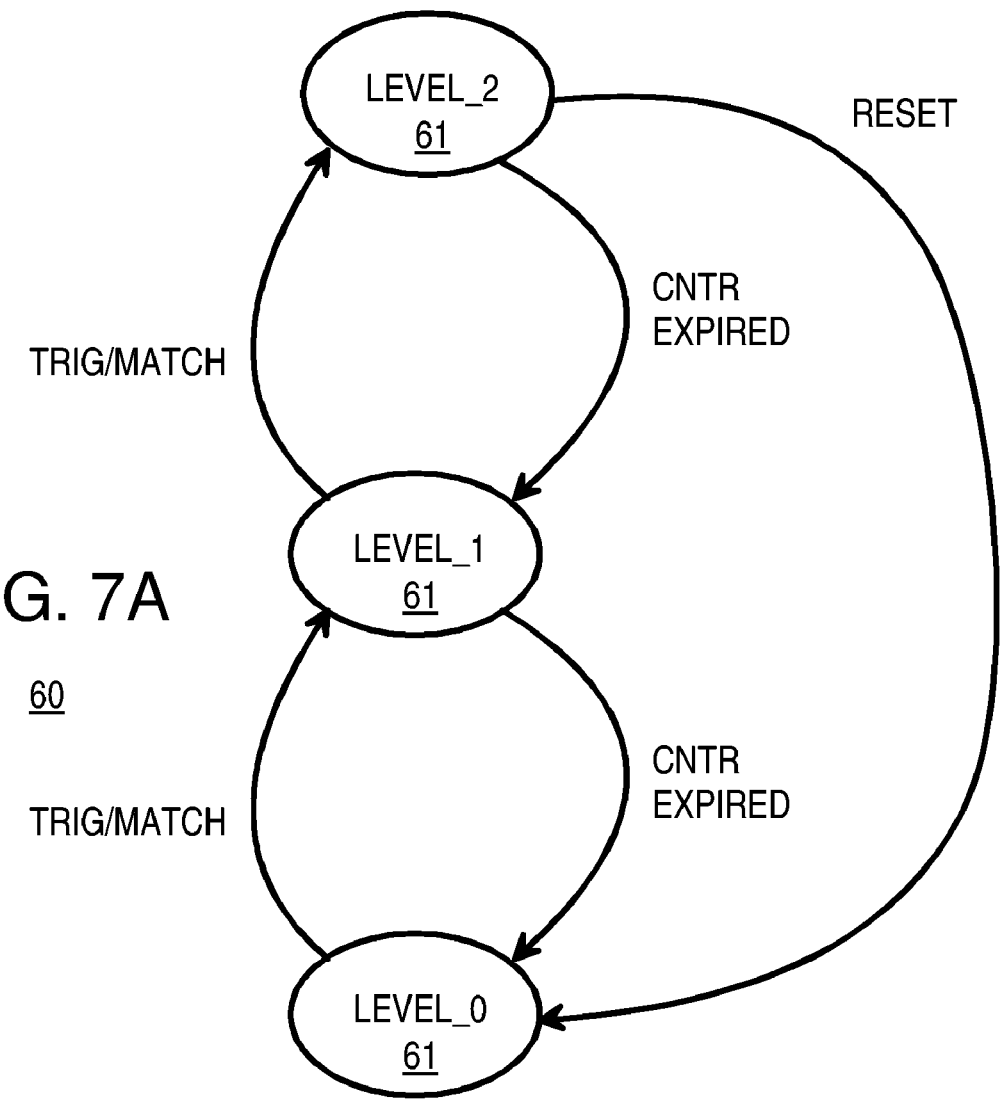
FIGS. 7A-B are state diagrams for the trigger state machine.
Figure 7B:
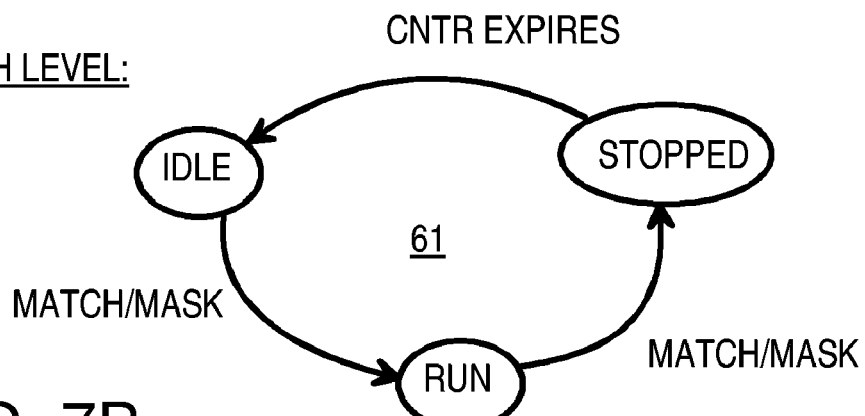

FIGS. 7A-B are state diagrams for the trigger state machine. In FIG. 7A, trigger state machine 60 has three sub-state-machines 61 at three levels. Level 0 is entered upon reset. When a trigger occurs, level 0 is exited and level 1 is entered. A counter is activated when entering level 1, and when this counter expires trigger state machine 60 returns to level 0.

However, when a second trigger occurs while in level 1, before the counter expires, trigger state machine 60 advances to level 2. Once the counter expires in level 2, trigger state machine 60 returns to level 1.

In FIG. 7B, each sub-state-machine 61 has an initial idle state. When a trigger occurs, sub-state-machine 61 advances from the idle state to the run state. Samples that are valid are stored into capture buffer 40 during the run state. When a second trigger occurs, sub-state-machine 61 advances to the stopped state and samples are no longer stored into capture buffer 40. A counter may also generate triggers. The counter may be started when entering the run state. When this counter expires, the idle state is entered. Sample storage can begin or end when a trigger is encountered. Having two triggers allows the first trigger to be activated when a first event occurs. The counter is then activated by the first trigger. If the second trigger occurs before the counter expires, samples before or after the second trigger may be stored. Samples may be stored and over-written by new samples starting when the first trigger occurs, and then frozen into the buffer when the second trigger occurs. Alternately, samples could be stored once the second trigger occurs within the counter time of the first trigger.

While in the stopped state, the external trigger could generate an interrupt, halting operation of the system chip and freezing trigger state machine 60 in the stopped state. Then an external tester or device could read the contents of capture buffer 40 out of the chip for external analysis. The stopped state could be entered after the trigger occurred and filling of capture buffer 40 with samples begins, and after the counter expired, which could correspond to the amount of time needed to fill capture buffer 40 with samples. Thus a full capture buffer 40 could be read out during the stopped state. The stopped state could be entered once capture buffer 40 becomes full by matching the counter to the number of samples that capture buffer 40 can hold, or by using a full flag from capture buffer 40 to cause trigger state machine 60 to enter the stopped state.

Alternately, only samples that match the trigger value may be stored in capture buffer 40. A mask may be used to examine only a few bits in the sample, such as a read/write control signal. Then bus reads could match the masked trigger and be stored in capture buffer 40, while writes are not stored into capture buffer 40. This can save space in capture buffer 40.

Sampling windows of time where a sequence of events are about to occur or have just occurred is a very powerful way to debug a functional problem on a microprocessor. For any number of triggers N in a state machine, another state machine with N+1 triggers always has marginally more functionality. However, adding an additional trigger also imposes a design and verification cost. Balancing these two tradeoffs based on past chip debug experience, a trigger state machine with 2 levels of triggers is used in one embodiment.

Rather than have a single trigger value, multiple trigger values and masks may be programmed into programmable registers 76 (FIG. 6). One trigger may be checked first, when trigger state machine 60 operates on level 0, while a second trigger values is checked while trigger state machine 60 operates in level 1. Also, each level could have a start trigger value and a stop trigger value. The terminal count value of counter 64 could also be programmable to allow a programmable period of time to look for the second trigger value after the first trigger occurs. The sequencing of states and levels could be programmable, such as disabling the highest level, or only enabling one level of trigger state machine 60. The first or second trigger match could advance trigger state machine 60 to the next level or reset to the next lower level, based on a programmable register.

Figure 8:
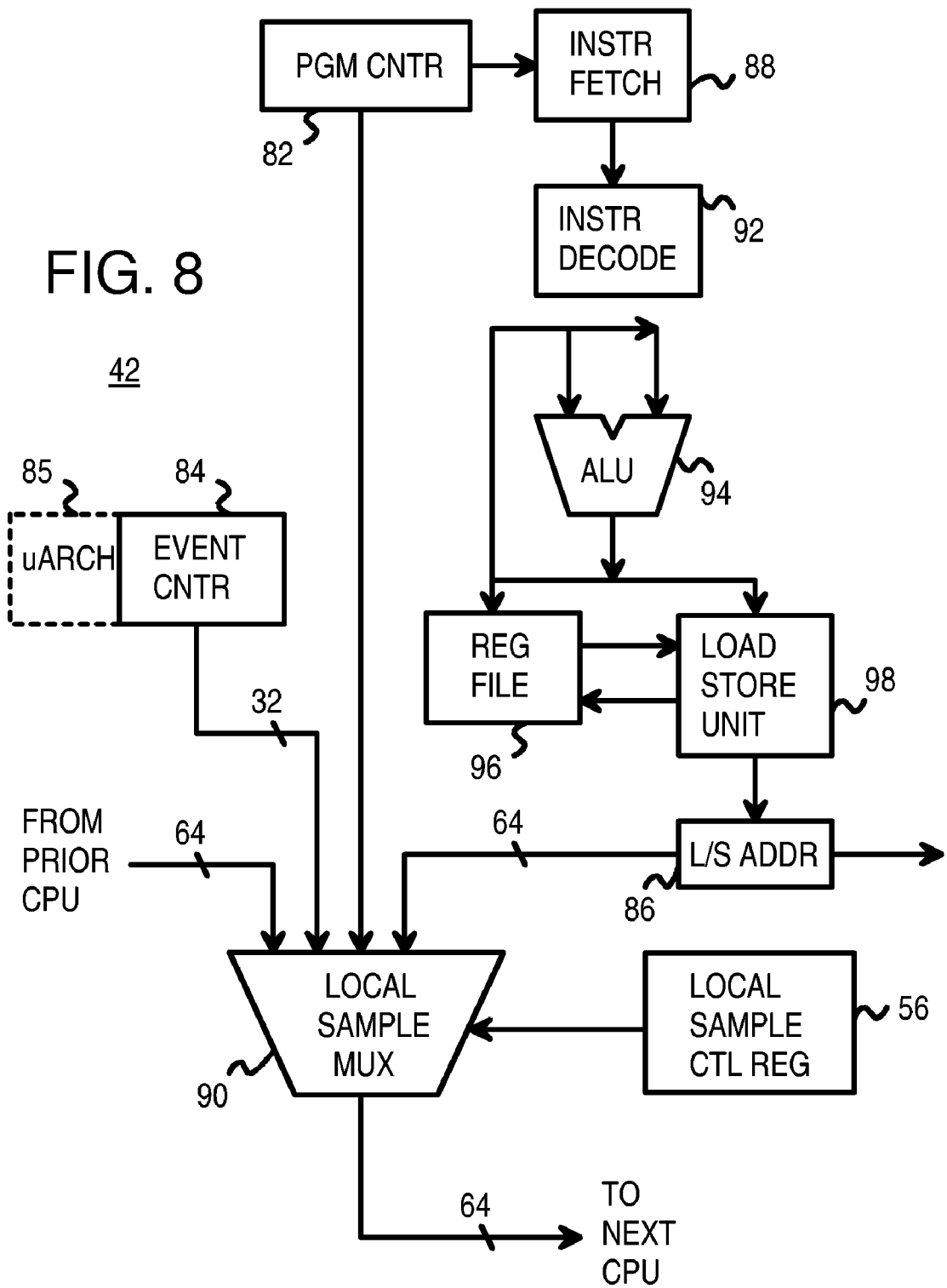
FIG. 8 is a diagram showing internal sample points in a processor core block.

FIG. 8 is a diagram showing internal sample points in a processor core block. CPU 42 is one of many blocks in a system chip, such as shown in FIG. 5. Selection control register 56 is programmed by the user to pass through samples from a prior block in a chain, or from one of the internal sample points. Local sample-select mux 90 selects the left-most input in pass-through mode to pass the prior block's sample along to the next block in the chain.

Selection control register 56 may be programmed to select program counter 82 for output through local sample-select mux 90. Program counter 82 is typically advanced by the instruction length for each sequential instruction fetched, and is loaded with a branch address when program branching occurs. Thus program counter 82 is quite useful for debugging.

The instruction address is generated from program counter 82 and the instruction is fetched by instruction fetcher 88 and decoded by instruction decoder 92. Arithmetic-logic-unit ALU 94 reads operands from register file 96, performs an operation indicated by the decoded instruction, and writes the result either back to register file 96, or to memory through load-store unit 98. Load-store address 86 generated by load-store unit 98 may be selected for sampling by local sample-select mux 90, allowing a series of load-store addresses to be sampled after the trigger.

Event counter 84 may count internal events such as taken branches, overflow or error flags from ALU 94, the number of instructions fetched or executed, etc. The contents of event counter 84 may also be selected for sampling by local sample-select mux 90. Other internal nodes such as inputs and outputs of ALU 94, register file 96, instruction decoder 92, etc. may be selectable for sampling in some embodiments.

Control signals and micro-architectural signals may also be selectable by local sample-select mux 90. Most circuits in CPU 42 have micro-architectural control signals 85 such as mux and bus selects signals, register controls, carry-in bits, register file addresses, and others that may also be selectable. Micro-architectural control signals 85 for event counter 84 are shown in the drawing, but many others are also present but not shown. These control signals could also be selectable for sampling. Chip designers and others could decide which internal signals to connect to local sample-select mux 90 to allow for sampling.

Other blocks such as caches, memory controllers, I/O, and snoop tags may have different internal sample points, and may have more than one local sample-select mux and selection control register. For example, a cache may have as selectable the tag address, index address, and data from all associative sets be selectable, along with hit, least-recently-used (LRU), valid, and other signals or bits.

ALTERNATE EMBODIMENTS

Several other embodiments are contemplated by the inventors. For example selection control register 56 could be shared among several CPU blocks in a column of CPU blocks (FIG. 5), or each CPU block could have its own selection control register 56. Various formats and decoding of control and selection register may be implemented. These and other registers and capture buffer 40 could be read and written using serial scan techniques such as JTAG, or using I/O instructions executed on one or more of the processor cores. An I/O instruction to enable a trigger could be inserted into a program before a known problem to enable triggering just before the problem event. A relatively small number of programmable registers can be used to control fairly complex triggers and thousands of internal sample nodes that can be sampled. A central CPU for debug is not required.

Rather than have a single 64-bit local sample-select mux 90 in each CPU block, two muxes could be provided to allow 128 bits to be passed through. The two 64-bit paths could be separately controlled by programmable registers. The width of the buses described herein could vary and be other than 32, 64, or 128 bits wide. Capture buffer 40 may also have various sizes, such as 1024×64, and can be constructed from static random-access memory (SRAM), flip-flops, dual-port memory, or other kinds of memory. Having capture buffer 40 in one location as one physical block of memory, or as part of a larger SRAM array, can have area savings over many separate local buffers.

Capture buffer 40 may be divided into multiple banks that may be separately written by the four OCLA slices. The banks may be interleaved to store more samples per unit of time, or may be written in sequence, one after another, to increase the number of samples that may be stored. The rate that samples are written into capture buffer 40 may thus be adjusted. A wrapped or overflow bit could be set when addresses loop around in capture buffer 40. The address pointer to capture buffer 40 could also be writeable or readable by the user.

Masking comparator 66 from two OCLA slices could operate on two 64-bit samples and a trigger could require that both 64 bit slices match their trigger values. Thus wider 128-bit triggers could be supported. The trigger match could be programmed to trigger on an address or data value on a bus, and/or other control signals such as read/write, enables, and any other signal that is sampled and sent to the on-chip logic analyzer from the block. Trigger state machines 60 could operate independently of each other, or could operate together in a cooperative fashion. The names and exact arrangements of states may vary in different embodiments.

Capture buffer 40 may operate at the processor clock speed, such as at 600 MHz. The long lines may operate at half the processor clock speed, so samples are sent over the OCLA long lines from the blocks to the on-chip logic analyzer at 300 MHz. If 600 MHz sample data is desired, the sample width may be limited to 32 bits, and alternate 600 MHz samples are presented on the high and low halves of the 64-bit long lines. This provides a maximal sample rate for four 64-bit long lines of 8×8 bytes×600 MHz=38.4 Gbytes/sec until capture buffer 40 becomes full. This rate is too high for immediately reading off-chip, so capture buffer 40 is filled first and then read at a slower rate.

The four partitions of capture buffer 40 may operate in several modes. In x1 mode, each of the four partitions acts as a separate debug buffer, independent of the other three. Each partition has its own trigger state machine 60 and its own triggers and count values. In x2 depth mode, capture buffer 40 acts as two independent debug buffers, with the first and third partitions being used together to hold twice as many samples. In x2 width mode, capture buffer 40 again acts as two independent debug buffers, with the first and third partitions being used together to hold samples that are double-width. In x4 mode, the four partitions are chained together to increase the depth to four times the normal depth, allowing more samples to be captured after a trigger. A trigger from one on-chip logic analyzer could be used to trigger all the other on-chip logic analyzers to capture many samples at a time when a trigger occurs. Other modes could also be supported.

Flow control is not needed. Samples can be sent from the sampled blocks to the on-chip logic analyzer without the on-chip logic analyzer sending back flow-control information or halting the sampling at the blocks. Samples do not have to be stalled at the blocks since the on-chip logic analyzer can discard samples.

While the on-chip logic analyzer may be used for debugging new designs, the on-chip logic analyzer is also useful for statistical sampling of internal events and for performance and power-consumption analysis. The latency from different blocks to the on-chip logic analyzer may vary. Blocks earlier in a chain may have a higher latency than blocks near the end of a chain. The user can account for the differing latencies and subtract the latency from the timestamp to determine the time a sample was collected at a block.

Sampled signals may be buffered by inverting or non-inverting buffers, or may be clocked into flip-flops, registers, or latches at various points. Some long lines may be buffered or clocked while others are not, and thus delays may vary and have to be taken into account by the debugger. The valid bit could be compared to a mask value, allowing the valid bit to be ignored if desired. Some OCLA muxes may only be able to select from among a subset of OCLA buses in some embodiments. The valid bit does not have to be stored in capture buffer 40, but it may be in some embodiments.

Logic and blocks may be implemented in a variety of ways. Logic may be synthesized from functional descriptions or logic equations. Inversions and buffering may be added in many places. Signal may be active-high or active-low. Automatic test-pattern generator (ATPG) and other tools may be used to create test patterns of data to program registers, triggers, and to read capture buffer 40.

While all blocks of a certain type could have the same internal signal nodes for sampling, blocks could vary in which internal signals are selectable for sampling. Two or more kinds of CPU blocks could be used, such as regular CPU blocks and extended CPU blocks.

There may be several other kinds of blocks that are not chained together for debug, such as memories, controllers, or a master CPU block. The invention may be applied to a variety of kinds of chips. Snoop tags, CPU's, caches, and other blocks may be replaced with other functional blocks and need not be present on each chip. For example, the invention could be applied to a chip without caches, without snoop tags, and even without general-purpose CPU's. The chip could have specialized blocks that perform a function such as communications processing.

Test and debug functions may be partitioned between an on-chip test controller and an off-chip external tester. Software, firmware, programmable logic, and custom logic may be used in various combinations. Chip "pins" may be leads of various shapes, solder balls, tabs, or other interconnect technology and are not strictly limited to pin-type interconnect that was originally used for chips.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A system chip with an on-chip logic analyzer integrated onto the system chip comprising:
   a plurality of local functional blocks that perform functions for the system chip;
   a local selector, in each local functional block, the local selector outputting sampled signals that are selected from internal nodes within a local functional block;
   a selection control register that controls the local selector;
   a trigger comparator that receives the sampled signals from the plurality of local functional blocks and compares the sampled signals to a trigger value to determine when a trigger occurs;
   a trigger state machine that enters a triggered state when the trigger occurs; and
   a capture buffer that stores the sampled signals when the trigger occurs;
   wherein the sampled signals are readable from the capture buffer for external analysis;
   whereby internal nodes from the plurality of local functional blocks are selected for storage in the capture buffer when the trigger occurs;
   wherein the trigger state machine comprises multiple levels of sub-state-machines;
   wherein the trigger comparator compares multiple trigger values to the sampled signals, wherein different trigger values are compared by the trigger comparator for the multiple levels of the trigger state machine;
   wherein the trigger state machine is multi-level and multi-triggered.

2. The system chip of claim 1 wherein the internal nodes for the plurality of local functional blocks together comprise at least one thousand separate signal nodes on the system chip;
   wherein the sampled signals may be selected from among any of the at least one thousand separate signal nodes on the system chip,
   whereby sampled signals for storage in the capture buffer are selectable from over one thousand signal nodes on the system chip.

3. The system chip of claim 2 wherein the local functional block is a processor core, a cache, or a memory controller.

4. The system chip of claim 3 wherein the plurality of local functional blocks comprises at least 16 processor cores and at least 4 caches.

5. The system chip of claim 3 wherein the internal nodes for a local functional block that is a processor core comprise a program counter, a load-store address, and micro-architectural signals generated by an instruction decoder,
   whereby the sampled signals are selected from a program counter, a load-store address, and micro-architectural signals.

6. The system chip of claim 3 wherein the sampled signals comprise a parallel word having at least 64 bits sent in parallel from the local functional block to the trigger comparator, wherein a new parallel word is sent to the trigger comparator for each transfer period, wherein a transfer period is a multiple of a local clock that controls operation of the local functional block,
   whereby 64-bit parallel words are sent from the local functional block to the trigger comparator as the sampled signals.

7. The system chip of claim 6 wherein the transfer period is twice as long as a period of the local clock, whereby sampled signals are transferred at a half frequency of the local clock for the local functional block.

8. The system chip of claim 1 wherein the selection control register comprises local registers that are distributed among the plurality of local functional blocks,
where each local register controls a local functional block in the plurality of local functional blocks,
whereby local registers control local selectors in each local functional block.

9. The system chip of claim 8 wherein the local selector also receives sampled signals from a prior local functional block in a chain of local functional blocks when the local functional block is not a first block in the chain;
wherein the selection control register indicates a pass-through mode when the local selector passes sampled signals from the prior local functional block through as the sampled signals,
whereby sampled signals from the prior local functional block are passed through in pass-through mode.

10. The system chip of claim 9 wherein the plurality of local functional blocks are arranged into a plurality of chains, each chain driving a parallel transfer bus in a plurality of parallel transfer buses;
further comprising:
a central mux that receives the plurality of the parallel transfer buses and selects a parallel transfer bus for output to the trigger comparator,
whereby parallel chains of local functional blocks are muxed to the trigger comparator by the central mux.

11. The system chip of claim 10 wherein the capture buffer comprises four partitions;
wherein the trigger comparator comprises four trigger comparators that compare sampled signals to four trigger values;
wherein the central mux comprises four central muxes that each select sampled signals to send to a different partition of the capture buffer and are compared to a different trigger value of the four trigger values,
wherein the four trigger values can trigger storage of four sets of sampled signals into the four partitions of the capture buffer.

12. The system chip of claim 11 further comprising:
a timestamp generator that generates a timestamp that indicates a relative time within the system chip;
wherein the trigger state machine writes the timestamp into the capture buffer in response to a trigger occurring;
whereby the timestamp is stored in the capture buffer with the sampled signals.

13. The system chip of claim 1 further comprising:
a counter, activated by the trigger occurring, the counter counting to a count value that is no more than a number of samples able to be stored in the capture buffer;
wherein the sampled signals are stored after a trigger occurs for a store-after-trigger mode;
wherein the trigger state machine halts storage of sampled signals when the counter reaches the count value after the trigger occurs for the store-after-trigger mode.

14. The system chip of claim 13 wherein the sampled signals are stored into the capture buffer until the trigger comparator detects that a trigger occurred;
wherein the trigger state machine halts storage of sampled signals into the capture buffer when the trigger occurs when operating in a store-before-trigger mode.

15. The system chip of claim 14 further comprising:
central programmable registers for storing trigger values, the count values, and mode settings for the trigger comparator and the trigger state machine;
wherein the central programmable registers control triggers and the trigger state machine.

16. The system chip of claim 1 wherein each local functional block further comprises:
a valid-bit generator that generates a valid bit in a valid state when the sampled signals are a valid sample, wherein the valid bit is sent to the trigger comparator with the sampled signals to validate the sampled signals;
a valid checker, coupled to the trigger comparator and receiving the valid bit for the sampled signals, for disabling storage of the sampled signals into the capture buffer when the valid bit not in the valid state,
whereby only locally-validated samples are stored into the capture buffer.

17. An on-chip logic analyzer comprising:
a plurality of debug buses from a plurality of chains of blocks distributed around a system chip, the debug buses carrying sampled words that are generated from internal nodes within blocks in the plurality of chains of blocks;
wherein the sampled words are locally selected by each block from a plurality of internal nodes within each block in response to user-programmable debug-node-select registers, or selected from a sampled words passed through from other blocks in a chain of blocks;
wherein the internal nodes comprise one thousand internal nodes on the system chip;
a first selector that receives a plurality of sampled words carried by the debug buses, the first selector selecting a first selected word from the plurality of sampled words from the plurality of chains of blocks;
a first selector register that causes the first selector to select the first selected word, the first selector register being programmable by a user;
a first trigger comparator, receiving a first trigger value, the first trigger comparator comparing the first selected word from the first selector to the first trigger value and generating a first trigger signal when a match occurs;
a first capture buffer that stores the first selected word and a sequence of first selected words in response to the first trigger signal;
a first trigger state machine that sequences state in response to the first trigger signal and activates the first capture buffer to store up to a predetermined number of first selected words in response to the first trigger signal; and
a first timestamp generator that inserts a timestamp entry into the first capture buffer in response to the first trigger signal,
whereby the first capture buffer is triggered by and stored sampled words that are selected from one thousand internal nodes on the system chip.

18. The on-chip logic analyzer of claim 17 further comprising:
a second selector that receives the plurality of sampled words carried by the debug buses, the second selector selecting a second selected word from the plurality of sampled words from the plurality of chains of blocks;
a second selector register that causes the second selector to select the second selected word, the second selector register being programmable by the user;

a second trigger comparator, receiving a second trigger value, the second trigger comparator comparing the second selected word from the second selector to the second trigger value and generating a second trigger signal when a match occurs;

a second capture buffer that stores the second selected word and a sequence of second selected words in response to the second trigger signal;

a second trigger state machine that sequences state in response to the second trigger signal and activates the second capture buffer to store up to a predetermined number of second selected words in response to the second trigger signal; and a second timestamp generator that inserts a timestamp entry into the second capture buffer in response to the second trigger signal, whereby dual triggers can store sampled words into dual capture buffers.

19. The on-chip logic analyzer of claim 18 further comprising:

a first masker, coupled to the first trigger comparator, that disables comparison of some bits of the first selected word in response to a user-programmable first mask register; and an external trigger signal, activated by the first trigger state machine, whereby the first trigger value is maskable.

20. A system chip having an on-chip logic analyzer comprising:

a plurality of functional blocks, each having a plurality of internal sample nodes that are not visible on external pins of the system chip, and each having a local select means for selecting a selected group of the plurality of internal sample nodes in response to a local selection control register, and for selecting a passed-through selected group from another functional block in the plurality of functional blocks in response to the local selection control register being in a pass-through mode;

central select means, receiving a plurality of the selected groups from the plurality of functional groups, for selecting a centrally-selected group from the plurality of the selected groups in response to a central selection control register;

trigger compare means, receiving the centrally-selected group and a trigger value, for comparing the trigger value to the centrally-selected group to signal a trigger when a match occurs;

capture buffer means for storing a sequence of samples of the centrally-selected group, the sequence being readable by an external user for debugging the system chip; and trigger state machine means for activating the capture buffer means to store the sequence of samples from the central select means in response to the trigger from the trigger compare means;

whereby samples from internal sample nodes locally selected by the plurality of functional blocks and centrally selected by the central select means are stored in the capture buffer means for external debugging.

* * * * *